United States Patent
Varis et al.

(10) Patent No.: US 6,975,177 B2
(45) Date of Patent: Dec. 13, 2005

(54) METHOD AND SYSTEM FOR A GENERATION OF A TWO-LEVEL SIGNAL

(75) Inventors: Jukka Varis, Halikko (FI); Seppo Rosnell, Salo (FI)

(73) Assignee: Nokia Corporation, Espoo (FI)

( * ) Notice: Subject to any disclaimer, the term of this patent is extended or adjusted under 35 U.S.C. 154(b) by 71 days.

(21) Appl. No.: 10/458,495

(22) Filed: Jun. 9, 2003

(65) Prior Publication Data

US 2004/0246060 A1 Dec. 9, 2004

(51) Int. Cl.$^7$ .................................................. H03K 7/00
(52) U.S. Cl. ...................... 332/106; 332/107; 375/238; 375/239; 375/298; 375/300; 375/353
(58) Field of Search ................................ 332/106, 107, 332/108, 109; 375/239, 238, 300, 353, 298, 302, 340

(56) References Cited

U.S. PATENT DOCUMENTS

| | | | |
|---|---|---|---|
| 6,650,711 B1 * | 11/2003 | Booth | ........................ 375/302 |
| 2004/0101065 A1 | 5/2004 | Hagh et al. | .................. 375/297 |

FOREIGN PATENT DOCUMENTS

| | | |
|---|---|---|
| EP | 1271870 | 1/2003 |
| WO | WO 03/034585 | 4/2003 |

OTHER PUBLICATIONS

"A 1V, 8GHz CMOS Integrated Phase Shifted Transmitter for Wideband and Varying Envelope Communications Systems", Hamedi–Hagh et al., IEEE 2003, Custom Integrated Circuits Conference, 4 page document.

"Wideband CMOS Integrated RF Combiner for LINC Transmitters", IFTU–59, Hamedi–Hagh et al., IEEE MTT–S Digest, 4 page document.

"Linear Amplification with Nonlinear Components" by D.C. Cox, IEEE Transactions on Communications, Dec. 1974, pp. 1942–1945.

"Current Mode Class–D Power Amplifiers for High Efficiency RF Applications" by H. Kobayashi et al, IEEE MTT–S 2001 International Microwave Symposium Digest, ppages 939–942.

"LINC Linear Transmitter Technology Review" by Bob Stengel IMS 2000 Workshop–Efficiency and Linearity Enhancement Methods for RF/MW Transmitters, Jun. 11, 2000.

* cited by examiner

*Primary Examiner*—Arnold Kinkead

(57) ABSTRACT

In a modulation system, in order to provide a two-level signal with a desired modulation which is suited to be amplified by a switching mode power amplifier, the modulation system may include a first constant envelope modulator modulating a signal according to a first control signal, a second constant envelope modulator modulating a signal according to a second control signal, and a combining portion combining the output signal of the first and said second constant envelope modulator to a single, two-level pulse-width-modulated signal. The information which is to be represented by the modulation of the single, two-level pulse-width-modulated signal is coded in the first and the second control signals. The invention relates equally to a corresponding method for generating a modulated signal.

17 Claims, 2 Drawing Sheets

METHOD AND SYSTEM FOR A GENERATION OF A TWO-LEVEL SIGNAL

FIELD OF THE INVENTION

The invention relates to a modulation system and to a method for generating a modulated signal.

BACKGROUND OF THE INVENTION

Modulation systems are known from the state of the art for modulating a first signal based on a second signal, for instance for modulating a radio frequency carrier based on information that is to be transmitted in a cellular system.

Due to the increasing requirements on spectral efficiency, variable envelope modulation methods have become more and more popular in cellular systems. With variable envelope modulation methods, however, the limited efficiency of conventional power amplifiers may cause heat and/or operation time problems in the transmitter equipment, in particular in thermally limited equipment like terminals. In order to reduce the amount of these effects, new transmitter architectures making use of switching mode power amplifiers have been proposed. Switching mode power amplifiers can theoretically approach a power efficiency of 100%. They have the disadvantage that they are extremely amplitude non-linear, but they do not alter significantly the phase of the input phase modulated signals.

A modulation system which enables a variable envelope modulation while making use of switching mode power amplifiers is the LINC (Linear Amplification with Nonlinear Components) system, which was proposed by D. C. Cox of the Bell Laboratories in "Linear Amplification with Nonlinear Components", IEEE Transactions on Communications, COM-22, pp. 1942 to 1945, December 1974. The basic principle of the LINC system is to represent any arbitrary bandpass signal, which has both amplitude and phase variations, by means of two signals which are of constant amplitude and have only phase variations. These two angle modulated signals can be amplified separately using power efficient nonlinear amplifiers. The outputs of these amplifiers are then combined by a summing unit in order to produce the desired variable amplitude signal. A problem of this system is the combination of two non-coherent amplified signals. The efficiency of the system varies with the momentary angle between the two amplified signals and will thus be below 100%.

In a pulse-width modulation (PWM) system, the original signal is coded to a two-level signal that has pulses of varying widths. The mean value of the two-level signal follows the desired output signal and can be extracted by filtering. Pulse density modulation (PDM) is an alternative way to accomplish the same task. These methods are widely used for switching mode power supplies.

A PWM system has been described for example in document EP 1 271 870 A2, which presents also a possibility of creating a three-level bandpass PWM signal instead of the traditional two-level low-pass PWM signals only.

Another pulse modulation method, which resembles the above-described PWM systems, is enabled by a Sigma-Delta modulation system. A bandpass Sigma-Delta modulator can also be employed for transforming a modulated sinusoidal carrier to a two-level signal.

It is desirable, however, to provide alternative solutions for coding an original control signal to a two-level signal.

SUMMARY OF THE INVENTION

It is an object of the invention to provide a modulation system and a method, which allow generation of a two-level signal with a desired modulation.

It is further an object of the invention to provide a modulation system and a method, which allow generation of a signal which is suited for amplification by a switching mode power amplifier.

A modulation system is proposed, which comprises a first constant envelope modulator modulating a signal according to a first control signal and a second constant envelope modulator modulating a signal according to a second control signal. The proposed system further comprises a combining portion combining the output signal of the first and the second constant envelope modulator to a single, two-level pulse-width-modulated signal. Information which is to be represented by a modulation of the single, two-level pulse-width-modulated signal is coded in the first and the second control signal.

In addition, a method for generating a modulated signal is proposed, which comprises modulating a signal according to a first control signal to obtain a first modulated constant envelope signal, modulating a signal according to a second control signal to obtain a second modulated constant envelope signal, and combining the first and the second modulated constant envelope signal to a single, two-level pulse-width-modulated signal. Again, information which is to be represented by a modulation of the single, two-level pulse-width-modulated signal is coded in the first and the second control signal.

The invention proceeds from the idea that the known LINC system can be redesigned to provide a two-level constant envelope signal. The information which is to be represented by a final modulation, e.g. amplitude and/or phase of an analog control signal, is coded into two control signals controlling the modulation applied by two constant envelope modulators. The modulation may comprise a phase modulation in case the output constant envelope signals are sinusoidal signals, and a modulation of transition times in case the output constant envelope signals are pulsed signals. The two constant envelope signals are then combined to a single two-level constant envelope signal.

It is an advantage of the invention that it provides a single constant envelope signal in the form of a two-level signal, which can be amplified using a single nonlinear amplifier, e.g. a switching mode amplifier. Thereby, the non-coherent power combining of the traditional LINC system can be avoided.

It is further an advantage of the invention that it provides an alternative to a Sigma-Delta modulator.

The constant envelope modulators of the proposed modulation system can be either digital constant envelope modulators or analog constant envelope modulators. Digital constant envelope modulators modulate the transition times of pulse trains going through. The input signals to the combining portion are in this case pulse position modulated (PPM) signals, whereas the output signal of the combining portion is a PWM signal. Analog constant envelope modulators modulate the phase of a sinusoidal carrier depending on a received control signal. The invention has the advantage over the known delta-signal modulation in that the width of the resulting pulses is not discrete, discrete pulse widths causing quantization noise.

The single two-level constant envelope signal which is generated in accordance with the invention can be provided in particular, though not exclusively, to a switching mode amplifier for amplification. If the single two-level constant envelope signal is fed to a switching mode amplifier, both high linearity and high power efficiency can be achieved in the amplification.

Known switching mode amplifiers are for instance class D or class E amplifiers. Class-E amplifiers, which are suitable for radio frequencies, do not work well with varying duty cycle of a provided signal, though. Class-D power amplifiers are inherently well suited for signal with varying duty cycles. Further, it has been presented by H. Kobayashi, J. Hinrichs and P. M. Asbeck in: "Current mode Class-D Power Amplifiers for High Efficiency RF Applications", IEEE MTT-S 2001 International Microwave Symposium Digest, pp. 939–942, that class D power amplifiers can also work at radio frequencies.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are merely intended to conceptually illustrate the structures and procedures described herein.

DETAILED DESCRIPTION OF THE INVENTION

Figure 1:
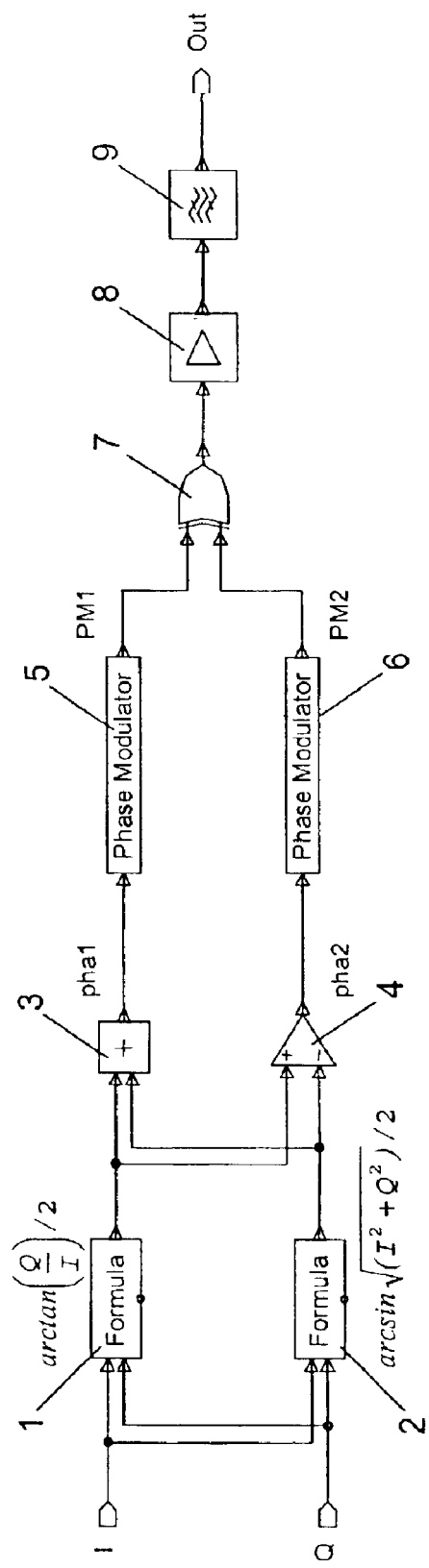
FIG. 1 is a schematic block diagram of an embodiment of a modulation system according to the invention.

FIG. 1 presents an exemplary embodiment of a modulation system according to the invention, which can be employed in a transmitter for achieving a variable envelope modulation of a radio frequency signal based on amplitude varying control signals.

In the modulation system of FIG. 1, a first input 'I' is connected on the one hand to a first processing component 1 and on the other hand to a second processing component 2. A second input 'I' is equally connected on the one hand to the first processing component 1 and on the other hand to the second processing component 2. The output of the first processing component 1 is connected to a first input of a summing unit 3 and to a non-inverting input of a subtraction unit 4. The output of the second processing component 2 is connected to a second input of the summing unit 3 and to an inverting input of the subtraction unit 4. The first and the second processing component 1, 2, the summing unit 3 and the subtraction unit 4 constitute an input signal processing portion of the modulation system of FIG. 1.

The output of the summing unit 3 is connected via a first phase modulator 5 to a first input of a logic exclusive-or circuit XOR 7. The output of the subtraction unit 4 is connected via a second phase modulator 6 to a second input of the XOR circuit 7. The input signal processing portion forms together with the two phase modulators 5, 6 and the XOR circuit 7 a pulsewidth modulator. Instead of the XOR circuit 7, an exclusive-nor circuit XNOR could be used.

The output of the XOR circuit 7 is connected via a switching mode power amplifier 8 and a bandpass filter 9 to an output 'Out', of the modulation system of FIG. 1.

The modulation system of FIG. 1 operates as follows.

A band-pass signal x(t) which is modulated in amplitude and phase can be represented in a canonical form as:

$$x(t)=I(t)\cdot\cos(\omega t)-Q(t)\cdot\sin(\omega t),$$

where I(t) and Q(t) constitute the in-phase and quadrature components of the signal.

In case such a band-pass signal x(t) is to be transmitted, a Digital Signal Processor DSP (not shown) determines the in-phase and quadrature components I(t) and Q(t) of the signal and provides them as voltages or currents of varying amplitudes to the first input 'I' and the second input 'Q', respectively, of the modulation system. Alternatively, the DSP could provide the in-phase and quadrature components as digital signals. Further alternatively, the in-phase and quadrature components could be determined and provided by a dedicated hardware.

Using the previously defined in-phase and quadrature components I(t) and Q(t), the phases $\phi_1$, $\phi_2$ for two separate constant envelope carriers can be calculated according to the following equations:

$$\phi_1=\theta+\alpha \text{ and}$$

$$\phi_2=\theta-\alpha,$$

where $\theta$ is the phase dependent angle:

$$\theta = \frac{\arctan\left(\frac{Q}{I}\right)}{2}$$

and where $\alpha$ is the amplitude dependent angle:

$$\alpha = \frac{\arcsin\sqrt{(I^2 + Q^2)}}{2}.$$

When calculating arctan(Q/I), all four quadrants should be taken into account according to the values of the I(t) and Q(t) signals. Compared to LINC system, the above defined phases $\phi_1$, $\phi_2$ have to be divided in addition by two, due to a frequency doubling that will take place later on at radio frequency.

The processing portion of the modulation system calculates control signals pha1, pha2, which will cause the first phase modulator 5 and the second phase modulator 6 to modulate a sinusoidal radio frequency signal according to the above defined phases $\phi_1$, $\phi_2$.

More specifically, the first processing component 1 of the processing portion calculates a signal arctan(Q/I)/2, while the second processing component 2 of the processing portion calculates a signal arcsin√I²+Q²/2.

The summing unit 3 of the processing portion then sums the signals output by the first processing component 1 and the second processing component 2, in order to obtain the first control signal pha1, which is used for controlling the first phase modulator 5. The first control signal pha1 is a control voltage, which causes the first phase modulator 5 to modulate the phase of a sinusoidal radio frequency signal with the phase $\phi_1$. The phase modulated constant envelope signal output by the first phase modulator 5 is referred to as signal PM1.

The subtraction unit 4 of the processing portion subtracts the signal output by the second processing component 2 from the signal output by the first processing component 1, in order to obtain the second control signal pha2, which is used for controlling the second phase modulator 6. The second control signal pha2 is a control voltage, which causes the second phase modulator 5 to modulate the phase of a sinusoidal radio frequency signal with the phase $\phi_2$. The signal output by the second phase modulator 6 is referred to as signal PM2.

In accordance with the above equations, the amplitude dependent angle a thus increases the phase $\phi_1$ of the signal PM1 output by the first phase modulator and decreases the phase $\phi_2$ of the signal output by the second phase modulator PM2, thereby coding the amplitude information in the phase difference of PM1 and PM2.

The signals PM1 and PM2 are provided to the XOR circuit 7. The XOR circuit 7 transforms the two signals PM1 and PM2 into a two-level PWM signal. This operation effectively doubles the frequency of the phase modulators 5, 6. Therefore, the center frequency FC of the phase modulators 5, 6 should be only half the desired transmitter output frequency Flo. It has to be noted that in some cases, the frequency doubling may even have a beneficial effect. For example, a mixing of the transmitted signal with the local oscillator can be avoided when Flo=FC/2.

The two-level PWM signal can now be amplified by the switching mode power amplifier 8 with a great linearity, since a two-level PWM signal has a constant envelope. The power amplified two-level PWM signal is then provided to the band-pass filter 9, which transforms the two-level PWM signal into a variable envelope modulated radio frequency signal, where the first harmonic of the two-level PWM signal is reflected in the amount of variation of the envelope. Finally, the variable envelope modulation radio frequency signal is provided via the output 'Out' of the modulation system to an antenna for transmission.

Figure 2:
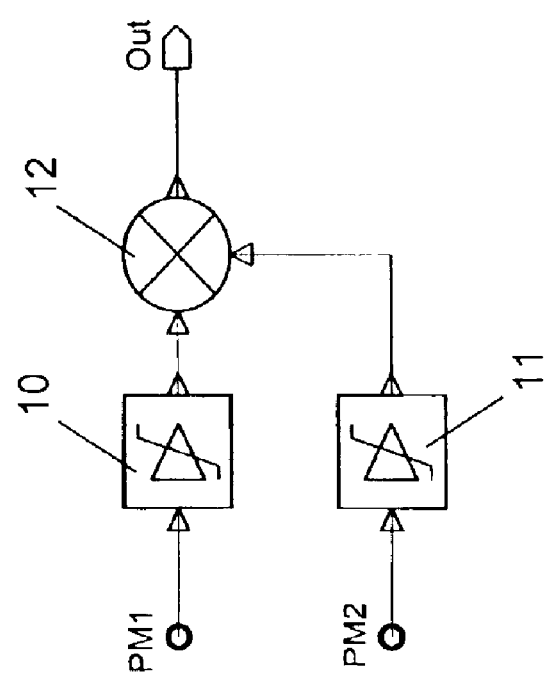
FIG. 2 illustrates a possible variation in the embodiment of FIG. 1.

The modulation system of FIG. 1 can be varied in many ways. One possible variation is illustrated in FIG. 2, which presents an alternative for the XOR circuit 7 of FIG. 1.

In this alternative, the output signal PM1 of the first phase modulator 5 is provided via a first limiter 10 to a mixer 12, while the output signal PM2 of the second phase modulator 6 is provided via a second limiter 11 to the mixer 12. The mixer 12 is an analog multiplier and thus constitutes an analog counterpart of an XNOR circuit. In order to obtain an analog counterpart of the XOR circuit 7 of FIG. 1 instead, a 180° phase shifter or a phase shifting/inverting amplifier would have to be connected in addition to the output of the mixer 12. However, such a phase shifting component can usually be omitted without causing any effect on the modulation process itself. The limiters 10, 11 ensure that the input signals provided to the mixer 12 have already only two levels, e.g. a first, positive level, whenever the signal PM1, PM2 output by the respective phase modulator 5, 6 is larger than zero, and a second, negative level, whenever the signal PM1, PM2 output by the respective phase modulator 5, 6 is smaller than zero.

It is to be noted that also in the embodiment presented in FIG. 1, limiters could be employed at the inputs of the XOR circuit 7, in order to enhance the operation of the XOR circuit 7.

In a further variation of the modulation system of FIG. 1, the phase modulators 5, 6 are replaced by digital modulators. In this case, the output signals PM1, PM2 of the modulators already constitute two-level signals, and limiters would not provide any advantage.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A modulation system comprising:
   a first constant envelope modulator modulating a signal according to a first control signal;
   a second constant envelope modulator modulating a signal according to a second control signal; and
   a combining portion combining output signals of said first and said second constant envelope modulators to a single, two-level pulse-width-modulated signal, wherein information for representation by a modulation of said single, two-level pulse-width-modulated signal is coded in said first and said second control signals wherein a center frequency of said first constant envelope modulator and of said second constant envelope modulator is half of a desired center frequency of said single, two-level pule-width-modulated signal.

2. The modulation system according to claim 1, further comprising a processing portion, which processing portion receives an in-phase component I and a quadrature component Q of an analog modulation signal containing said information which is for representation by a modulation of said single, two-level pulse-width-modulated signal, and which processing portion calculates said first signal as $$\frac{\arctan\left(\frac{Q}{I}\right) + \arcsin\left(\sqrt{I^2 + Q^2}\right)}{2}$$

and said second control signal as $$\frac{\arctan\left(\frac{Q}{I}\right) - \arcsin\left(\sqrt{I^2 + Q^2}\right)}{2}.$$

3. The modulation system according to claim 1, wherein said first and said second constant envelope modulators are analog constant envelope modulators modulating a sinusoidal signal in phase based on said first and said second control signal.

4. The modulation system according to claim 3, further comprising a first limiter converting the output signal of said first constant envelope modulator into a two-level signal, before it is provided to said combining unit, and a second limiter converting the output signal of said second constant envelope modulator into a two-level signal, before it is provided to said combining unit.

5. The modulation system according to claim 1, wherein said first and said second constant envelope modulators are digital constant envelope modulators outputting a respective pulsed signal, in which the transition times are modulated based on said first and said second control signals, respectively.

6. The modulation system according to claim 1, wherein said combining unit comprises a logic exclusive-or circuit.

7. The modulation system according to claim 1, wherein said combining unit comprises a logic exclusive-nor circuit.

8. The modulation system according to claim 1, wherein said combining unit comprises an analog mixer.

9. The modulation system according to claim 1, further comprising a switching mode power amplifier amplifying said single, two-level pulse-width-modulated signal provided by said combining unit.

10. The modulation system according to claim 9, further comprising at least one of a bandpass filter and a lowpass filter for generating a variable envelope signal out of said amplified single, two-level, pulse-width-modulated signal provided by said switching mode power amplifier.

11. A method for generating a modulated signal, said method comprising:

modulating a signal according to a first control signal to obtain a first modulated constant envelope signal;

modulating a signal according to a second control signal to obtain a second modulated constant envelope signal; and combining said first modulated constant envelope signal and said second modulated constant envelope signal into a single, two-level pulse-width-modulated signal, wherein information for representation by a modulation of said single, two-level pulse-width-modulated signal is coded in said first control signal and said second control signal wherein a center frequency of said first constant envelope signal and of said second constant envelope signal before modulation is selected to be half of a desired center frequency of said single, two-level pulse-width-modulated signal.

12. The method according to claim 11, wherein said first control signal is calculated as $$\frac{\arctan\left(\frac{Q}{I}\right) + \arcsin\left(\sqrt{I^2 + Q^2}\right)}{2}$$

and wherein said second control signal is calculated as $$\frac{\arctan\left(\frac{Q}{I}\right) - \arcsin\left(\sqrt{I^2 + Q^2}\right)}{2},$$

with I being an in-phase component and Q a quadrature component of an analog modulation signal containing said information which is for said representation by said modulation of said single, two-level pulse-width-modulated signal.

13. The method according to claim 11, wherein said first and said second constant envelope signals are sinusoidal signals which are modulated in phase based on said first and said second control signal.

14. The method according to claim 11, further comprising converting said first modulated constant envelope signal and said second modulated constant envelope signal into respective two-level signals before combining them.

15. The method according to claim 11, wherein said first modulated constant envelope signal and said second modulated constant envelope signal are pulsed constant envelope signals, in which the transition times are modulated based on said first control signal and said second control signal.

16. The method according to claim 11, further comprising amplifying said single, two-level pulse-width-modulated signal by means of a switching mode power amplifier.

17. The method according to claim 16, further comprising generating a variable envelope signal by filtering said amplified single, two-level, pulse-width-modulated signal.

* * * * *

UNITED STATES PATENT AND TRADEMARK OFFICE
CERTIFICATE OF CORRECTION

PATENT NO. : 6,975,177 B2
DATED : December 13, 2005
INVENTOR(S) : Jukka Varis et al.

It is certified that error appears in the above-identified patent and that said Letters Patent is hereby corrected as shown below:

Column 6,
Line 24, "pule" should be -- pulse --.
Line 31, after "first", insert -- control --.

Signed and Sealed this

Eighteenth Day of April, 2006

JON W. DUDAS
*Director of the United States Patent and Trademark Office*